US008575632B2

(12) United States Patent
Kuramoto et al.

(10) Patent No.: US 8,575,632 B2
(45) Date of Patent: Nov. 5, 2013

(54) LIGHT-EMITTING DEVICE, METHOD FOR MANUFACTURING SAME, MOLDED BODY AND SEALING MEMBER

(75) Inventors: Masafumi Kuramoto, Anan (JP); Tomohide Miki, Anan (JP); Tomoya Tsukioka, Anan (JP); Tomohisa Kishimoto, Anan (JP)

(73) Assignee: Nichia Corporation, Anan-shi (JP)

( * ) Notice: Subject to any disclaimer, the term of this patent is extended or adjusted under 35 U.S.C. 154(b) by 1067 days.

(21) Appl. No.: 11/997,734

(22) PCT Filed: Jul. 28, 2006

(86) PCT No.: PCT/JP2006/314970
§ 371 (c)(1),
(2), (4) Date: Feb. 1, 2008

(87) PCT Pub. No.: WO2007/015426
PCT Pub. Date: Feb. 8, 2007

(65) Prior Publication Data
US 2010/0155739 A1    Jun. 24, 2010

(30) Foreign Application Priority Data
Aug. 4, 2005  (JP) ................................. 2005-226083

(51) Int. Cl.
*H01L 33/32*  (2010.01)
*H01L 33/60*  (2010.01)
*H01L 33/00*  (2010.01)
*C08L 63/00*  (2006.01)

(52) U.S. Cl.
USPC .......................................................... 257/96

(58) Field of Classification Search
None
See application file for complete search history.

(56) References Cited

U.S. PATENT DOCUMENTS

| 6,180,726 | B1 * | 1/2001 | Eklund et al. ................. 525/408 |
| 6,924,596 | B2 * | 8/2005 | Sato et al. ..................... 313/512 |
| 2003/0080341 | A1 * | 5/2003 | Sakano et al. .................. 257/79 |
| 2003/0132701 | A1 | 7/2003 | Sato et al. |

(Continued)

FOREIGN PATENT DOCUMENTS

| EP | 1 369 458 A1 | 12/2003 |
| EP | 1 609 835 A1 | 12/2005 |

(Continued)

OTHER PUBLICATIONS

European Search Report dated Dec. 7, 2010, issued in corresponding EP application 06781860.

(Continued)

*Primary Examiner* — Matthew W. Such
*Assistant Examiner* — Robert Carpenter
(74) *Attorney, Agent, or Firm* — Birch, Stewart, Kolasch & Birch, LLP (57) ABSTRACT

Disclosed is a light-emitting device comprising a light-emitting element (10) composed of a gallium nitride compound semiconductor having an emission peak wavelength of not less than 430 nm; a molded body (40) provided with a recessed portion having a bottom surface on which the light-emitting element (10) is mounted and a lateral surface; and a sealing member (50) containing an epoxy resin including a triazine derivative epoxy resin, or a silicon-containing resin. The molded body (40) is obtained by using a cured product of a thermosetting epoxy resin composition essentially containing an epoxy resin including a triazine derivative epoxy resin, and has a reflectance of not less than 70% at the wavelengths of not less than 430 nm.

27 Claims, 2 Drawing Sheets

(56) References Cited

U.S. PATENT DOCUMENTS

| | | |
|---|---|---|
| 2003/0178632 A1 | 9/2003 | Hohn et al. |
| 2003/0208008 A1* | 11/2003 | Rubinsztajn .......... 525/533 |
| 2004/0122208 A1* | 6/2004 | Okada .......... 528/408 |
| 2004/0245541 A1* | 12/2004 | Shitagaki et al. .......... 257/103 |
| 2010/0104794 A1* | 4/2010 | Aoki et al. .......... 428/76 |

FOREIGN PATENT DOCUMENTS

| | | |
|---|---|---|
| JP | 6-179737 | 6/1994 |
| JP | 2656336 B2 | 5/1997 |
| JP | 2000-196151 A | 7/2000 |
| JP | 2001-234032 A | 8/2001 |
| JP | 2001-240652 A | 9/2001 |
| JP | 2002-30133 A | 1/2002 |
| JP | 2002-302533 A | 10/2002 |
| JP | 2003-209286 A | 7/2003 |
| JP | 2003-224305 A | 8/2003 |
| JP | 2003-309229 A | 10/2003 |
| JP | 3512732 B2 | 1/2004 |
| JP | 2004-172636 | 6/2004 |
| JP | 2004-182956 A | 7/2004 |
| JP | 2004-528472 A | 9/2004 |
| JP | 2005-146191 | 6/2005 |
| JP | 2005-159090 A | 6/2005 |
| JP | 2005-259972 A | 9/2005 |
| JP | 2005-306952 A | 11/2005 |
| JP | 2006-156704 A | 6/2006 |
| WO | 02/098981 A1 | 12/2002 |

OTHER PUBLICATIONS

Miyawaki et al., "Advanced technology relating to resin for white light LED and LED package", Electronics Mount Technology; Apr. 2004.

EP Search Report dated Dec. 7, 2011, issued in corresponding application No. 11155918.3

JP Office Action issued in corresponding JP App. No. 2007-529235 on Jan. 5, 2012.

JP Court Hearing issued on May 21, 2013.

European Opposition filed in EPO for corresponding European Patent EP 1914811, dated Apr. 5, 2013.

* cited by examiner

LIGHT-EMITTING DEVICE, METHOD FOR MANUFACTURING SAME, MOLDED BODY AND SEALING MEMBER

TECHNICAL FIELD

This invention relates to a light-emitting device for use as luminaires, displays, mobile phone backlights, moving picture illuminating auxiliary light sources, and other general commercial light sources, a method for preparing the same, a molded part, and a sealing member.

BACKGROUND ART

Surface mount light-emitting devices using light-emitting elements feature a small size, a good power efficiency, and light emission of brilliant color. The light-emitting elements eliminate the risk of lamp failures since they are semiconductor elements. They are also characterized by improved initial drive performance and resistance to vibration and repeated turn-on and off. Because of these improved properties, light-emitting devices using light-emitting elements such as light-emitting diodes (LED) and laser diodes (LD) are utilized as light sources in varying applications. Recently, light-emitting elements have marked a rapid advance toward higher outputs.

For the surface mount light-emitting devices, thermoplastic resins such as liquid crystal polymers, polyphenylene sulfide (PPS) and nylon are often used as molded parts due to ease of mass-scale production.

On the other hand, epoxy resins are used in sealing members for protecting the light-emitting elements from moisture, dust and contaminants (see, for example, Patent Reference 1: JP 3512732, Patent Reference 2: JP-A 2001-234032, and Patent Reference 3: JP-A 2002-302533).

Also silicone resins are used as the output of light-emitting elements is increased.

However, prior art thermoplastic resins used as moldings in surface mount light-emitting devices are less resistant to light due to the inclusion of an aromatic component within the molecule although they are resistant to heat. Also, since hydroxyl groups or other groups for improving adhesion are absent at molecular ends, the resins exhibit poor adhesion to leads and sealing members. In particular, sealing members using silicone resins lack long-term reliability since they show a drastic drop in adhesion to molded parts using thermoplastic resins, as compared with sealing members using epoxy resins.

Epoxy resins are used as sealing members, but not as molded parts in leadframe type surface mount devices because of their difficulty to mold.

Also, light-emitting elements of gallium nitride compound semiconductor capable of blue emission produce higher outputs than light-emitting elements capable of red emission and also generate more amounts of heat. Thus, degradation of molded parts becomes a problem when light-emitting elements of blue emission are used.

Also, JP 2656336 (Patent Reference 4) describes an optical semiconductor device wherein an encapsulating resin is a cured product of a B-staged epoxy resin composition for optical semiconductor encapsulation comprising an epoxy resin, a curing agent, and a cure accelerator, wherein the constituent components are uniformly mixed at a molecular level. It is described that the epoxy resin used herein is typically a bisphenol A epoxy resin or bisphenol F epoxy resin, and triglycidyl isocyanate or the like may also be used. In Example, triglycidyl isocyanate is used and added in a small amount to a bisphenol type epoxy resin. As long as the present inventors have empirically studied, the B-staged epoxy resin composition for semiconductor encapsulation suffers from a problem of yellowing during long-term holding at high temperatures.

JP 2656336 (Patent Reference 4) describes: "The epoxy resin composition for optical semiconductor encapsulation is advantageously used as encapsulants for light-sensing elements in compact disc players, line sensors and area sensors which are solid-state image sensors. Optical semiconductor devices in which light-sensing elements such as solid-state image sensors are encapsulated with such epoxy resin compositions for optical semiconductor encapsulation are high-performance products which form images free of fringes caused by optical variations of the resin or black dots caused by foreign particles in the encapsulating resin. Despite resin encapsulation, they exhibit at least equivalent performance to ceramic packages." It is thus understood that the encapsulating resin of this patent is used with light-sensing elements, but not for the encapsulation of light-emitting elements.

In this regard, JP-A 2000-196151 (Patent Reference 5), JP-A 2003-224305 (Patent Reference 6) and JP-A 2005-306952 (Patent Reference 7) refer to the use of triazine derived epoxy resins in epoxy resin compositions for the encapsulation of light-emitting elements. These epoxy resins, however, are not solid materials obtained by reacting a triazine derived epoxy resin with an acid anhydride.

Known references relating to the present invention include the foregoing and Patent References 8 and 9 and Non-Patent Reference 1, listed below.

Patent Reference 1: JP 3512732
Patent Reference 2: JP-A 2001-234032
Patent Reference 3: JP-A 2002-302533
Patent Reference 4: JP 2656336
Patent Reference 5: JP-A 2000-196151
Patent Reference 6: JP-A 2003-224305
Patent Reference 7: JP-A 2005-306952
Patent Reference 8: JP-A 2005-259972
Patent Reference 9: JP-A 2006-156704
Non-Patent Reference 1: Electronics Mount Technology, April 2004

DISCLOSURE OF THE INVENTION

Problem to be Solved by the Invention

Accordingly, an object of the invention is to provide a light-emitting device using a molded part with improved heat resistance and light resistance, and a method for preparing the same. Another object of the invention is to provide a molded part and a sealing member for use in a light-emitting device.

Means for Solving the Problems

Making extensive investigations to solve the outstanding problems, the inventors have completed the present invention.

One aspect of the invention relates to a light-emitting device comprising a light-emitting element comprising a gallium nitride compound semiconductor having an emission peak wavelength of 430 nm or longer, and a molded part on which the light-emitting element is disposed, the molded part using a cured product of a thermosetting epoxy resin composition comprising an epoxy resin including a triazine derived epoxy resin. A light-emitting device with improved heat resistance and light resistance is then provided even when the light-emitting element comprising a gallium nitride compound semiconductor is used.

The molded part is preferably a cured product of a thermosetting epoxy resin composition comprising (A) the epoxy resin including a triazine derived epoxy resin, and further comprising (B) an acid anhydride, (C) an antioxidant, (D) a curing catalyst, (E) a reflective member, and (F) an inorganic filler. This molded part has a good curability, improved heat resistance and light resistance, and a satisfactory strength.

The thermosetting epoxy resin composition preferably comprises a solid material in ground form obtained by melt mixing (A) the epoxy resin including a triazine derived epoxy resin with (B) an acid anhydride and (C) an antioxidant. The composition is then improved in flexural strength.

In this embodiment, the thermosetting epoxy resin composition preferably comprises as a resin component a solid material in ground form obtained by reacting a triazine derived epoxy resin with an acid anhydride in such a proportion as to provide an epoxy group equivalent/acid anhydride group equivalent ratio from 0.6 to 2.0. More preferably, the reaction of a triazine derived epoxy resin with an acid anhydride is effected in the presence of an antioxidant; or the reaction of a triazine derived epoxy resin with an acid anhydride is effected in the presence of a curing catalyst or a curing catalyst and an antioxidant. Also preferably, the thermosetting epoxy resin composition further comprises (E) a reflective member and (F) an inorganic filler.

The molded part preferably has a reflectance of at least 70% at 430 nm or longer. A light-emitting device featuring a high radiation efficiency from the light-emitting element is then available.

Preferably the molded part has a recess with a bottom surface and a side surface, the light-emitting element is disposed on the bottom surface of the recess, and the light-emitting element is sealed with a sealing member comprising an epoxy resin including a triazine derived epoxy resin or a silicon-containing resin. Then adhesion to the molded part is significantly improved.

Another aspect of the invention relates to a light-emitting device comprising a light-emitting element having an emission peak wavelength of 430 nm or longer, and a molded part on which the light-emitting element is disposed, the molded part using a cured product of a thermosetting epoxy resin composition comprising an epoxy resin including a triazine derived epoxy resin, an acid anhydride, a reflective member, and a curing catalyst as essential components. A to light-emitting device with improved heat resistance and light resistance is then provided. Also in this embodiment, the epoxy resin including a triazine derived epoxy resin and the acid anhydride are preferably compounded in the thermosetting epoxy resin composition as a solid material in ground form obtained by reacting the triazine derived epoxy resin with the acid anhydride in such a proportion as to provide an epoxy group equivalent/acid anhydride group equivalent ratio from 0.6 to 2.0. More preferably, the reaction of the triazine derived epoxy resin with the acid anhydride is effected in the presence of an antioxidant; or the reaction of the triazine derived epoxy resin with the acid anhydride is effected in the presence of the curing catalyst or the curing catalyst and an antioxidant, so that the curing catalyst is also compounded as the solid material in ground form.

A further aspect of the invention relates to a method for preparing a light-emitting device comprising the first step of mixing a solid material in ground form obtained by melt mixing (A) an epoxy resin including a triazine derived epoxy resin with (B) an acid anhydride and (C) an antioxidant, with (D) a curing catalyst, (E) a reflective member, and (F) an inorganic filler, the second step of molding a thermosetting epoxy resin composition resulting from the first step in a mold with leads arranged in place by a transfer molding technique, and the third step of disposing a light-emitting element on the leads on a cured product of the thermosetting epoxy resin composition resulting from the second step. Then a light-emitting device using a molded part in the form of a cured product of a thermosetting epoxy resin composition is readily provided.

Also provided is a method for preparing a light-emitting device comprising the first step of mixing a solid material in ground form obtained by reacting a triazine derived epoxy resin with an acid anhydride in such a proportion as to provide an epoxy group equivalent/acid anhydride group equivalent ratio from 0.6 to 2.0, with (D) a curing catalyst, (E) a reflective member, and (F) an inorganic filler, the second step of molding a thermosetting epoxy resin composition resulting from the first step in a mold with leads arranged in place by a transfer molding technique, and the third step of disposing a light-emitting element on the leads on a cured product of the thermosetting epoxy resin composition resulting from the second step. Preferably in this embodiment, the reaction of the triazine derived epoxy resin with the acid anhydride is effected in the presence of an antioxidant; or the reaction of the triazine derived epoxy resin with the acid anhydride is effected in the presence of the curing catalyst or the curing catalyst and an antioxidant, so that the curing catalyst is also compounded as the solid material in ground form.

A still further aspect of the invention relates to a molded part for use in a light-emitting device, formed from a cured product of a thermosetting epoxy resin composition comprising (A) an epoxy resin including a triazine derived epoxy resin, (B) an acid anhydride, (C) an antioxidant, (D) a curing catalyst, (E) a reflective member, and (F) an inorganic filler, components (A), (B) and (C) being compounded as a solid material in ground form obtained by melt mixing them. A molded part having improved heat resistance and light resistance is then provided.

A still further aspect of the invention relates to a sealing member for use in a light-emitting device, formed from a cured product of a thermosetting epoxy resin composition comprising (A) an epoxy resin including a triazine derived epoxy resin, (B) an acid anhydride, (C) an antioxidant, and (D) a curing catalyst, components (A), (B) and (C) being compounded as a solid material in ground form obtained by melt mixing them. A sealing member having improved heat resistance and light resistance is then provided.

It is noted that photo-couplers are not encompassed within the scope of the invention and should be excluded.

BENEFITS OF THE INVENTION

The light-emitting device of the invention has improved heat resistance, light resistance and adhesion. The molded part on which a light-emitting element is disposed is improved in curability, has a satisfactory strength, and maintains heat resistance, light resistance and adhesion over a long term. The sealing member gives a cured product which is uniform and generates little variation in color.

BEST MODE FOR CARRYING OUT THE INVENTION

Figure 1:
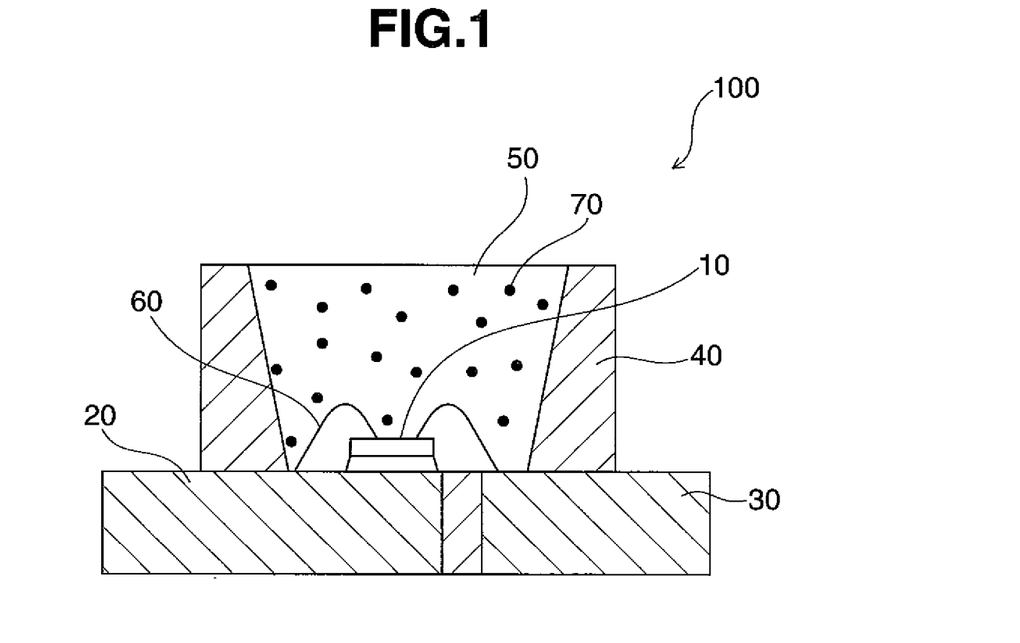
FIG. 1 is a schematic cross-sectional view of a surface mount light-emitting device according to one embodiment of the invention.
Figure 2:
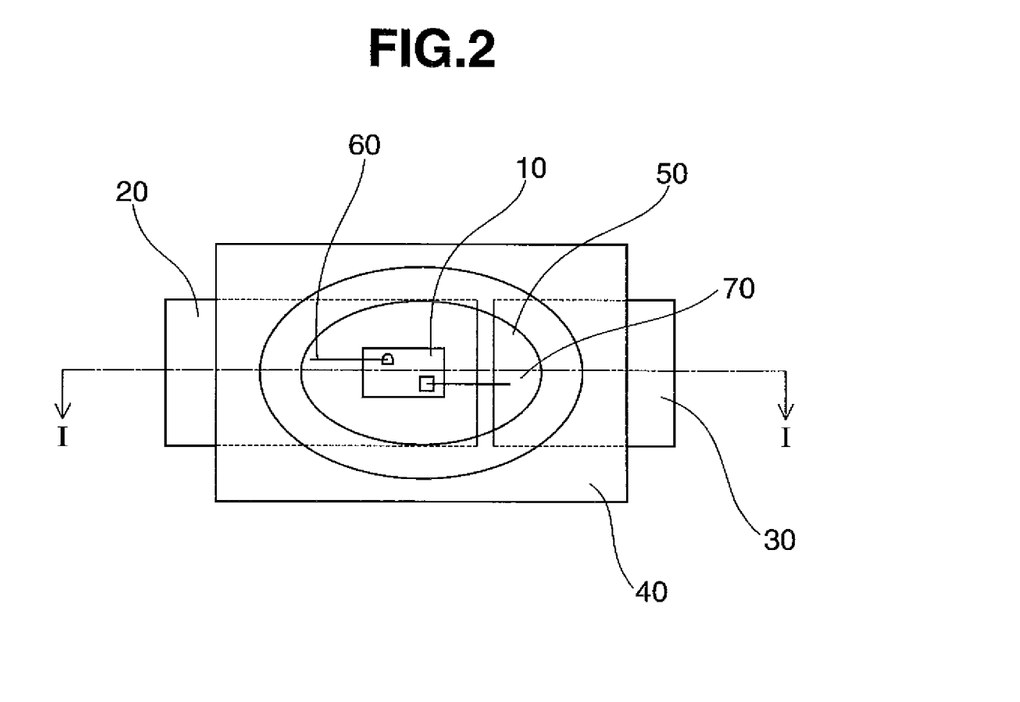
FIG. 2 is a schematic plan view of the surface mount light-emitting device of the embodiment.

Now, the light-emitting device, molded part, sealing member and methods for preparing them are described by referring to their embodiments and examples. It is understood that the invention is not limited to the embodiments and examples illustrated herein. A surface mount light-emitting device according to one embodiment of the invention is described with reference to the figures. FIG. 1 is a schematic cross-sectional view of a surface mount light-emitting device according to one embodiment of the invention. FIG. 2 is a schematic plan view of the surface mount light-emitting device of this embodiment. FIG. 1 is a schematic cross-sectional view taken along lines I-I in FIG. 2.

The light-emitting device 100 comprises a light-emitting element 10 comprising a gallium nitride compound semiconductor having an emission peak wavelength of 430 nm or longer, and a molded part 40 on which the light-emitting element 10 is disposed. The molded part 40 preferably uses a cured product of a thermosetting epoxy resin composition comprising (A) an epoxy resin including a triazine derived epoxy resin, (B) an acid anhydride, (C) an antioxidant, (D) a curing catalyst, (E) a reflective member, and (F) an inorganic filler. The molded part 40 has first and second leads 20 and 30. The molded part 40 has a recess with a bottom surface and a side surface, and the light-emitting element 10 is disposed on the bottom surface of the recess. The light-emitting element 10 has a pair of positive and negative electrodes, which are electrically connected to the first and second leads 20 and 30 via wire segments 60. The light-emitting element 10 is encapsulated with a sealing member 50. The sealing member 50 is preferably formed of an epoxy resin including a triazine derived epoxy resin or a silicon-containing resin selected from among flexible and rigid silicone resins, a rigid silicone resin, an epoxy-modified silicone resin, a modified silicone resin alone or a mixture of two or more because adhesion to the molded part 40 is then enhanced. Notably, encapsulation with another epoxy resin or urethane resin is possible. The sealing member 50 contains a phosphor 70 for converting the wavelength of emission from the light-emitting element 10. The molded recessed part 40 prepared using a mold or the like has such a high reflectance as to reduce the transmission of light into the bottom and side surfaces of the recess in the molded part 40 and to increase the release of light toward the front surface.

The molded part 40 is selected to have a high reflection efficiency at 430 nm or longer since the light-emitting element 10 used has an emission peak wavelength of 430 nm or longer. Then the majority of light emitted by the light-emitting element 10 is not absorbed in the molded part 40, but released to the exterior, leading to a high radiant efficiency from the light-emitting element 10. Inversely, if a molded part 40 having a low reflectance is used, the majority of light emitted by the light-emitting element 10 is absorbed in the molded part 40, whereby degradation of the molded part 40 is accelerated.

Molded Part

The molded part 40 used herein is a cured product of a thermosetting epoxy resin composition comprising (A) an epoxy resin including a triazine derived epoxy resin, (B) an acid anhydride, (C) an antioxidant, (D) a curing catalyst, (E) a reflective member, and (F) an inorganic filler. The respective components are described below.

A. Epoxy Resin

Component (A) is an epoxy resin which contains a triazine derived epoxy resin.

A-1: Triazine Derived Epoxy Resin

The triazine derived epoxy resin is effective for restraining a cured product of a thermosetting epoxy resin composition from yellowing and for establishing a semiconductor light-emitting device with little degradation with time. The triazine derived epoxy resin is preferably a 1,3,5-triazine nucleus derived epoxy resin. In particular, an epoxy resin having isocyanurate rings has excellent light resistance and electrical insulation, and should preferably have a divalent, more preferably trivalent epoxy group per isocyanurate ring. Specifically, tris(2,3-epoxypropyl) isocyanurate, tris(α-methylglycidyl) isocyanurate or the like may be used.

The triazine derived epoxy resin preferably has a softening point of 90 to 125° C. It is noted that those resins having hydrogenated triazine rings are excluded from the triazine derived epoxy resin.

A-2: Hydrogenated Epoxy Resin

A hydrogenated epoxy resin (A-2) may be used in combination with the triazine derived epoxy resin. The hydrogenated epoxy resin is preferably an epoxy resin obtained by hydrogenating an aromatic epoxy resin, and more preferably an epoxy resin having the following general formula (1).

[Chemical Formula 1]

(1)

Herein, $R^1$ and $R^2$ which may be the same or different is a hydrogen atom, methyl group or cyclohexyl group, and n is an integer of 0 to 20.

It is noted that the hydrogenated epoxy resin (A-2) preferably has a softening point of 70 to 100° C.

A-3: Other Epoxy Resin

Also, if necessary, an epoxy resin (A-3) other than the foregoing (A-1) and (A-2) may be used in combination in an amount below a certain level as long as this does not compromise the effect of the invention. Exemplary epoxy resins include bisphenol A type epoxy resins, bisphenol F type epoxy resins, biphenol type epoxy resins such as 3,3',5,5'-tetramethyl-4,4'-biphenol type epoxy resins and 4,4'-biphenol type epoxy resins, phenol novolac type epoxy resins, cresol novolac type epoxy resins, bisphenol A novolac type epoxy resins, naphthalene diol type epoxy resins, trisphenylol methane type epoxy resins, tetrakisphenylol ethane type epoxy resins, and epoxy resins obtained through hydrogenation of aromatic rings in phenol dicyclopentadiene novolac type epoxy resins.

It is noted that the other epoxy resin (A-3) preferably has a softening point of 70 to 100° C.

The epoxy resin as component (A) is the triazine derived epoxy resin (A-1) optionally in admixture with the hydrogenated epoxy resin (A-2) and other epoxy resin (A-3). Components (A-1) and (A-2) are preferably used in such a proportion as to provide a weight ratio (A-1):(A-2) in the range from 10:0 to 2:8, specifically from 8:2 to 2:8, and more specifically from 7:3 to 3:7. Too high a ratio of hydrogenated epoxy resin (A-2) may lead to a drop of heat resistance and light resistance. Also, component (A-3) is preferably admixed in a proportion of up to 30% by weight and more preferably up to 10% by weight, based on the total weight of epoxy resins.

B. Acid Anhydride

Component (B) is an acid anhydride which serves as a curing agent. It should preferably be non-aromatic and free of a carbon-carbon double bond in order to provide light resistance. Exemplary acid anhydrides include hexahydrophthalic anhydride, methylhexahydrophthalic anhydride, trialkyltetrahydrophthalic anhydride, and hydrogenated methylnadic anhydride, with the methylhexahydrophthalic anhydride being preferred. These acid anhydride curing agents may be used alone or in admixture of two or more.

The acid anhydride curing agent is preferably compounded in an amount to provide 0.5 to 2.0 equivalents and more preferably 0.7 to 1.5 equivalents of acid anhydride per equivalent of the epoxy resin. Less than 0.5 equivalent may result in under-curing and a loss of reliability. If the amount is more than 2.0 equivalents, the unreacted curing agent may be left in the cured product to adversely affect the moisture resistance thereof.

In this regard, where only the triazine derived epoxy resin (A-1) is used as component (A), the preferred amount of the acid anhydride curing agent compounded is such that 0.6 to 2.0 equivalents, more preferably 1.0 to 2.0 equivalents, and even more preferably 1.2 to 1.6 equivalents of acid anhydride groups are available per equivalent of epoxy groups in the triazine derived epoxy resin. Less than 0.6 equivalent may result in under-curing and a loss of reliability. If the amount is more than 2.0 equivalents, the unreacted curing agent may be left in the cured product to adversely affect the moisture resistance thereof.

C. Antioxidant

Component (C) is an antioxidant which may be selected from phenol, phosphorus and sulfur based antioxidants. Examples of suitable antioxidants are described below.

Examples of phenol based antioxidants include 2,6-di-t-butyl-p-cresol, butylated hydroxyanisole, 2,6-di-t-butyl-p-ethylphenol, stearyl-β-(3,5-di-t-butyl-4-hydroxyphenyl)propionate, 2,2'-methylenebis(4-methyl-6-t-butylphenol), 4,4'-butylidenebis(3-methyl-6-t-butylphenol), 3,9-bis[1,1-dimethyl-2-{β-(3-t-butyl-4-hydroxy-5-methyl -phenyl)propionyloxy}ethyl]-2,4,8,10-tetraoxaspiro[5.5]-undecane, 1,1,3-tris(2-methyl-4-hydroxy-5-t-butylphenyl)butane, and 1,3,5-trimethyl-2,4,6-tris(3,5-di-t-butyl-4-hydroxybenzyl)-benzene. Inter alia, 2,6-di-t-butyl-p-cresol is preferred.

Examples of phosphorus based antioxidants include triphenyl phosphite, diphenyl alkyl phosphites, phenyl dialkyl phosphites, tri(nonylphenyl) phosphite, trilauryl phosphite, trioctadecyl phosphite, distearyl pentaerythritol diphosphite, tris(2,4-di-tert-butylphenyl)phosphite, diisodecyl pentaerythritol diphosphite, di(2,4-di-tert-butylphenyl) pentaerythritol diphosphite, tristearyl sorbitol triphosphite, and tetrakis(2,4-di-tert-butylphenyl)-4,4'-biphenyl diphosphonate. Inter alia, triphenyl phosphite is preferred.

Examples of sulfur based antioxidants include dilauryl-3,3'-thiodipropionate, dimyristyl-3,3'-thiodipropionate, and distearyl-3,3'-thiodipropionate.

These antioxidants may be used alone. Preferably a phosphorus based antioxidant is used alone, or a phenol based antioxidant and a phosphorus based antioxidant are used in combination. In this regard, the phenol based antioxidant and the phosphorus based antioxidant are used in such a proportion that a weight ratio of phenol based antioxidant to phosphorus based antioxidant is in the range from 0:100 to 70:30, and more preferably from 0:100 to 50:50.

The antioxidant is preferably compounded in an amount of 0.01 to 10 parts, and more preferably 0.03 to 5 parts by weight per 100 parts by weight of the epoxy resin composition. Too less an amount of the antioxidant may fail to achieve sufficient heat resistance and allow for discoloration. Too much the antioxidant may become cure-inhibitory, failing to acquire sufficient cure and strength.

D. Curing Catalyst

Component (D) is a curing catalyst which may be selected from well-known curing catalysts used in epoxy resin compositions. Exemplary curing catalysts include, but are not limited to, tertiary amines, imidazoles, and organic carboxylic acid salts thereof, organic carboxylic acid metal salts, metal-organic chelate compounds, aromatic sulfonium salts, organic phosphine compounds, and salts thereof, which may be used alone or in admixture. Of these, imidazoles and phosphorus based curing catalysts are more preferred, for example, 2-ethyl-4-methylimidazole, methyl-tributylphosphonium-dimethyl phosphate, and quaternary phosphonium bromide.

The cure accelerator is preferably used in an amount of 0.05 to 5%, and more preferably 0.1 to 2% by weight based on the entire composition. Outside the range, the cured product of the epoxy resin composition may lose a balance of heat resistance and moisture resistance.

In the practice of the invention, components (A), (B) and (C) should be previously melt mixed at 70 to 120° C., preferably 80 to 110° C., to form a solid material having a softening point of 50 to 100° C., preferably 60 to 90° C., and the solid material be ground prior to compounding. If the material obtained by melt mixing has a softening point below 50° C., it does not become solid. A softening point above 100° C. leads to a loss of flow.

In a more preferred embodiment, the triazine derived epoxy resin (A-1) is used alone as component (A), components (A-1) and (B), preferably components (A-1), (B) and (C) are previously reacted at 70 to 120° C., preferably 80 to 110° C., for 4 to 20 hours, preferably 6 to 15 hours, or components (A-1), (B) and (D), preferably components (A-1), (B), (C) and (D) are previously reacted at 30 to 80° C., preferably 40 to 60° C., for 10 to 72 hours, preferably 36 to 60 hours, to form a solid material having a softening point of 50 to 100° C., and preferably 60 to 90° C., and the solid material is ground prior to compounding. If the material resulting from reaction has a softening point below 50° C., it may not become solid. A softening point above 100° C. may lead to a loss of flow.

In the preferred embodiment, if the reaction time is too short, the material may not become solid due to a low content of high molecular weight fraction. If the reaction time is too long, the flow may become less.

The solid reaction product obtained herein is preferably the reaction product of the triazine derived epoxy resin as component (A) with the acid anhydride as component (B), which contains a high molecular weight fraction having a molecular weight of more than 1500, a moderate molecular weight fraction having a molecular weight of 300 to 1500, and a monomeric fraction, as analyzed by gel permeation chromatography (GPC) (under analytical conditions: sample concentration 0.2 wt %, feed volume 50 μL, mobile phase THF 100%, flow rate 1.0 mL/min, temperature 40° C., and a detector RI), wherein 20 to 70% by weight of the high molecular weight fraction, 10 to 60% by weight of the moderate molecular weight fraction, and 10 to 40% by weight of the monomeric fraction are present.

In the embodiment wherein triglycidyl isocyanate is used as component (A), the solid reaction product mentioned above contains a reaction product represented by the following formula (2), and especially a reaction product represented by the following formula (3) when the acid anhydride as component (B) is methylhexahydrophthalic anhydride.

oxide and the like may also be used. Titanium dioxide is compounded as a white colorant for enhancing whiteness and has a unit lattice which may be either rutile or anatase type. It is not limited in average particle size and shape. The titanium dioxide may be previously surface treated with hydrous oxides of aluminum, silicon or the like for enhancing its compatibility with and dispersibility in resins and inorganic fillers.

An amount of titanium dioxide loaded is preferably 2 to 80% by weight and more preferably 5 to 50% by weight of the entire composition. Less than 2% by weight may fail to achieve a sufficient whiteness whereas more than 80% by weight may adversely affect molding properties, leaving unfilled or void defects.

F. Inorganic Filler

For the inorganic filler as component (F), any fillers other than component (E) commonly compounded in epoxy resin

[Chemical Formula 2]

In the formulae, R is an acid anhydride residue, and n is an arbitrary number in the range of 0 to 200. The reaction product has an average molecular weight of 500 to 100,000. The solid reaction product according to the invention preferably contains 20 to 70%, especially 30 to 60% by weight of a high molecular weight fraction with a molecular weight of more than 1500, 10 to 60%, especially 10 to 40% by weight of a moderate molecular weight fraction with a molecular weight of 300 to 1500, and 10 to 40%, especially 15 to 30% by weight of a monomeric fraction (unreacted epoxy resin and acid anhydride).

The epoxy resin composition of the invention contains the resin component obtained by the above-mentioned procedure. If the antioxidant (C) and the curing catalyst (D) are not used during the preparation of the resin component, the antioxidant (C) and the curing catalyst (D) are preferably compounded with the resin component at the stage when the epoxy resin composition is prepared.

In the epoxy resin composition, the following components may be further compounded.

E. Reflective member

For the reflective member as component (E), titanium dioxide is especially preferred, although barium titanate, zinc compositions may be used. Examples include silicas such as fused silica and crystalline silica, alumina, silicon nitride, aluminum nitride, boron nitride, glass fibers, and antimony trioxide. These inorganic fillers are not particularly limited in average particle size and shape.

The inorganic filler which has been surface treated with coupling agents such as silane coupling agents and titanate coupling agents may be compounded for enhancing the bond strength between the resin and the inorganic filler.

Suitable and preferable coupling agents include, for example, epoxy functional alkoxysilanes such as γ-glycidoxypropyltrimethoxysilane, γ-glycidoxypropylmethyldiethoxysilane, and β-(3,4-epoxycyclohexyl)ethyltrimethoxysilane, amino functional alkoxysilanes such as N-β-(aminoethyl)-γ-aminopropyltrimethoxysilane, γ-aminopropyltriethoxysilane, and N-phenyl-γ-aminopropyltrimethoxysilane, and mercapto functional alkoxysilanes such as γ-mercaptopropyltrimethoxysilane. It is understood that the amount of the coupling agent used for surface treatment and the surface treatment technique are not particularly limited.

An amount of the inorganic filler added is preferably 20 to 700 parts by weight and more preferably 50 to 400 parts by weight per 100 parts by weight of the epoxy resin (A) and the acid anhydride (B) combined. Less than 20 pbw may fail to achieve a sufficient strength whereas more than 700 pbw may result in unfilled defects due to a viscosity buildup and failures such as separation within the device or package due to a loss of flexibility. The inorganic filler is preferably contained in an amount of 10 to 90% by weight and more preferably 20 to 80% by weight based on the entire composition.

Other Additives

In the epoxy resin composition of the invention, various additives may be compounded if necessary. For example, various stress-reducing agents such as thermoplastic resins, thermoplastic elastomers, organic synthetic rubbers and silicones, waxes, halogen trapping agents, and other additives may be added and compounded for the purpose of improving certain properties of the resin insofar as this does not compromise the effects of the invention.

Preparation of Epoxy Resin Composition

The epoxy resin composition of the invention is prepared as a molding compound, preferably by previously combining components (A), (B) and (C) together, uniformly melt mixing them at a temperature in the range of 70 to 120° C., and preferably 80 to 110° C. on a suitable equipment such as a solventless reactor which can be heated, until the mixture undergoes a viscosity buildup to reach a softening point sufficient to handle at room temperature, specifically of 50 to 100° C. and preferably 60 to 90° C., then cooling the mixture into a solid mixture. It is noted that where components (A-1), (B) and (D), or components (A-1), (B), (C) and (D) are used, these components are preferably combined and reacted at a temperature of 30 to 80° C., more preferably 40 to 60° C. as in the foregoing procedure.

With respect to the temperature range where the selected components are mixed in these embodiments, if the mixing temperature is too low, it fails to form a mixture which becomes solid at room temperature. If the mixing temperature is too high, too high a reaction rate makes it difficult to terminate the reaction at the desired extent of reaction.

Next, the mixture is ground, following which components (E) and (F) and other additives are compounded in predetermined formulation ratios. The resulting mixture is fully uniformly mixed on a mixer or the like, then melt mixed on a hot roll mill, kneader or extruder, cooled for solidification, and comminuted into a suitable size. The resulting epoxy resin composition is ready for use as molding compound.

The white epoxy resin composition of the invention thus obtained may be advantageously utilized as molded parts in semiconductor and electronic equipment, especially using light-emitting elements, or encapsulants for light-emitting elements and other semiconductor devices. Excluded are light-sensing elements and photo-couplers having light-emitting and sensing elements integrated.

The encapsulation method which is most generally used in this application is low-pressure transfer molding. Notably, the epoxy resin composition of the invention is desirably molded at a temperature of 150 to 185° C. for 30 to 180 seconds. Post-cure may be effected at 150 to 195° C. for 2 to 20 hours.

Light-Emitting Element

The light-emitting element 10 used herein should have an emission peak wavelength of 430 nm or longer because the molded part 40 exhibits a high reflectance and possesses light resistance at or above that wavelength. Use of a gallium nitride compound semiconductor is particularly preferred. A light-emitting device of the prior art construction that a light-emitting element comprising a gallium nitride compound semiconductor is disposed on a molded part of PPS has the problem that the molded part can be degraded by the heat release from the light-emitting element because the light-emitting elements of gallium nitride compound semiconductor produce more amounts of heat upon electric current conduction than light-emitting elements of GaP, GaAs or the like. The light-emitting element 10 of gallium nitride compound semiconductor used herein is prepared by depositing a semiconductor such as GaN, InGaN, or InAlGaN on a substrate to form a light-emitting layer.

Sealing Member

The sealing member 50 is preferably formed using an epoxy resin including a triazine derived epoxy resin or a silicon-containing resin as typified by a silicone resin.

The sealing member 50 using an epoxy resin including a triazine derived epoxy resin offers enhanced adhesion since it is of the same material system as the molded part 40. Since the light-emitting element 10 of gallium nitride compound semiconductor reaches a temperature of at least 100° C. upon electric current conduction, both the sealing member 50 and the molded part 40 are thermally expanded, though to a slight extent. When the sealing member 50 and the molded part 40 are formed of materials of the same system, they have approximate coefficients of thermal expansion so that little separation occurs at the interface between the sealing member 50 and the molded part 40.

While most sealing members using silicon-containing resins tend to be less adherent to prior art molded parts using thermoplastic resins, their adhesion can be increased when the molded part 40 is made of the epoxy resin composition of the invention. Since the light-emitting element 10 of gallium nitride compound semiconductor emits blue light having a high level of emission energy upon electric current application, the sealing member in close contact with the light-emitting element 10 is most prone to degradation. The rate of degradation can be minimized by forming the sealing member from silicon-containing resins, typically silicone resins. Similarly, although the surface of the molded part 40, that is, its adhesion interface to the sealing member 50 is also degraded by light and has a likelihood of separation, the adhesion interface between the sealing member of light resistant silicon-containing resin and the molded part of the inventive epoxy resin composition is least prone to failure.

Also, the sealing member 50 used herein may be a member formed from a cured product of a thermosetting epoxy resin composition comprising (A) an epoxy resin including a triazine derived epoxy resin, (B) an acid anhydride, (C) an antioxidant, and (D) a curing catalyst, wherein components (A), (B) and (C) are compounded as a solid material in ground form obtained by previously melt mixing components (A), (B) and (C) at 70 to 120° C. to form a solid mixture having a softening point of 50 to 100° C. and grinding the mixture.

Phosphor

The phosphor 70 may be any of compounds which absorb light from the light-emitting element 10 and wavelength convert it into light of a different wavelength. Use may be made of, for example, rare earth based aluminate salt phosphors activated mainly with a lanthanoid element like Ce, such as represented by $Y_3Al_5O_{12}$:Ce, $(Y,Gd)_3Al_5O_{12}$:Ce, and $Y_3(Al,Ga)_5O_{12}$:Ce.

EXAMPLE

Examples and Comparative Examples are given below for further illustrating the invention although the invention is not limited to these Examples.

Examples 1 to 10

Of the components shown in Table 1, the epoxy resin, acid anhydride and antioxidant were previously melt mixed on a reactor at 100° C. for 3 hours. The mixture was cooled for solidification (softening point 60° C.), ground, and thereafter compounded with other components in the predetermined compositional ratio. This was uniformly melt mixed on a hot twin-roll mill, cooled, and ground, yielding a cured product of a white epoxy resin composition serving as a molded part for use in a light-emitting device. The starting materials used herein are described below.

(A) Epoxy resin
  (A-1) Triazine Derived Epoxy Resin
    (i) Tris(2,3-epoxypropyl) isocyanate (trade name TEPIC-S by Nissan Chemical Industries, Ltd., epoxy equivalent 100)
  (A-2) Hydrogenated epoxy resin
    (ii) Hydrogenated bisphenol A type epoxy resin (trade name YL-7170 by Japan Epoxy Resins Co., Ltd., epoxy equivalent 1200)
    (iii) Hydrogenated biphenyl type epoxy resin (trade name YL-7040 by Japan Epoxy Resins Co., Ltd., epoxy equivalent 220)
  (A-3) Other Aromatic Epoxy Resin
    (iv) Bisphenol A type epoxy resin (trade name E1004 by Japan Epoxy Resins Co., Ltd., epoxy equivalent 890)
(B) Acid anhydride
  (v) Carbon-carbon double bond-free acid anhydride, methylhexahydrophthalic anhydride (trade name Rikacid MH by New Japan Chemical Co., Ltd.)
(D) Titanium dioxide, rutile type (trade name Tipaque CR-90 by Ishihara Sangyo Kaisha Ltd.)
(E) Inorganic filler: ground fused silica (trade name by Tatsumori K.K.)
(F) Curing catalyst
  (x) Phosphorus-based curing catalyst: methyl-tributyl-phosphonium-dimethyl phosphate (trade name PX-4 MP by Nippon Chemical Industrial Co., Ltd.)
  (xi) Imidazole catalyst: 2-ethyl-4-methylimidazole (trade name 2E4MZ by Shikoku Chemicals Corp.)

These compositions were measured for the following properties. The results are shown in Table 1.

Spiral Flow
Using a mold according to EMMI standards, a spiral flow was measured at 175° C. and 6.9 N/mm$^2$ for a molding time of 120 seconds.

Melt Viscosity
Using a constant-load orifice type flow tester with a nozzle having a diameter of 1 mm, a viscosity was measured at a temperature of 175° C. and a load of 10 kgf.

Flexural Strength
A cured part was formed at 175° C. and 6.9 N/mm$^2$ for a molding time of 120 seconds using a mold according to EMMI standards, and measured for flexural strength according to JIS K-6911.

Heat Resistance or Yellowing
A disk having a diameter of 50 mm and a thickness of 3 mm was molded at 175° C. and 6.9 N/mm$^2$ for a molding time of 2 minutes and allowed to stand at 180° C. for 24 hours, after which yellowness was compared.

TABLE 1

| Formulation | | | Example | | | | | | | | | |
|---|---|---|---|---|---|---|---|---|---|---|---|---|
| | (pbw) | | 1 | 2 | 3 | 4 | 5 | 6 | 7 | 8 | 9 | 10 |
| (A) | A-1 | (i) | 9 | 9 | 8 | 4 | 6 | 9 | 2 | | | |
| | A-2 | (ii) | | | 3 | 11 | | | 71 | 20 | | |
| | | (iii) | | | | | 6 | | | | | |
| | A-3 | (iv) | | | | | | | | | 20 | 21 |
| (B) | Acid anhydride | (v) | 14 | 14 | 12 | 8 | 12 | 14 | 5 | | 3 | |
| | | (vi) | | | | | | | | 3 | | |
| | Phenolic resin | (vii) | | | | | | | | | | 2 |
| (C) | Antioxidant | (viii) | 0.1 | 0.1 | 0.1 | 0.1 | 0.1 | 0.1 | | 0.1 | 0.1 | 0.1 |
| | | (ix) | | 0.1 | 0.1 | 0.1 | 0.1 | | | 0.1 | 0.1 | 0.1 |
| Premixing of (A) + (B) + (C) | | | Yes | Yes | Yes | Yes | Yes | No | No | Yes | Yes | Yes |
| (D) | Curing catalyst | (x) | | 0.1 | 0.1 | 0.1 | 0.1 | | | 0.1 | 0.1 | 0.1 |
| | | (xi) | 0.1 | | | | | 0.1 | | | | |
| (E) | Titanium dioxide | | 6 | 6 | 6 | 6 | 6 | 6 | 6 | 6 | 6 | 6 |
| (F) | Inorganic filler | | 70 | 70 | 70 | 70 | 70 | 70 | 70 | 70 | 70 | 70 |
| Test results | Spiral flow, inch | | 15 | 25 | 20 | 18 | 20 | 15 | 15 | 25 | 18 | 17 |
| | Melt viscosity, Pa-s | | 80 | 60 | 90 | 100 | 80 | 80 | 120 | 90 | 100 | 120 |
| | Flexural strength, N/mm$^2$ | | 100 | 110 | 150 | 180 | 120 | 80 | 150 | 60 | 90 | 160 |
| | Heat resistance or Yellowing | | white | white | white | white | white | light yellow | light yellow | yellow | yellow | pale yellow |

(vi) Carbon-carbon double bond-bearing acid anhydride, tetrahydrophthalic anhydride (trade name Rikacid TH by New Japan Chemical Co., Ltd.)
  (vii) Phenol novolac resin (trade name TD-2131 by Dainippon Ink & Chemicals, Inc.)
(C) Antioxidant
  (viii) Phosphorus-based antioxidant: triphenyl phosphite (trade name by Wako Pure Chemical Industries, Ltd.)
  (ix) Phenol-based antioxidant: 2,6-di-t-butyl-p-cresol (trade name BHT by Wako Pure Chemical Industries, Ltd.)

Examples 1 to 5 wherein components (A), (B) and (C) were premixed are improved in many properties over Examples 6 and 7 wherein they were not premixed. Examples 1 to 5 wherein component (B) is an acid anhydride which is non-aromatic and free of a carbon-carbon double bond are improved in many properties over Example 8 wherein component (B) has a carbon-carbon double bond. Examples 1 to 5 using component (A-1) and/or (A-2) are improved in many properties over Examples 9 and 10 using component (A-3). Examples 1 to 5 remain white in the heat resistance or yellowing test whereas Examples 6 to 10 yellow. Therefore, Examples 1 to 5 are highly heat resistant and their molded parts are found undegraded.

Reflectance

Figure 3:
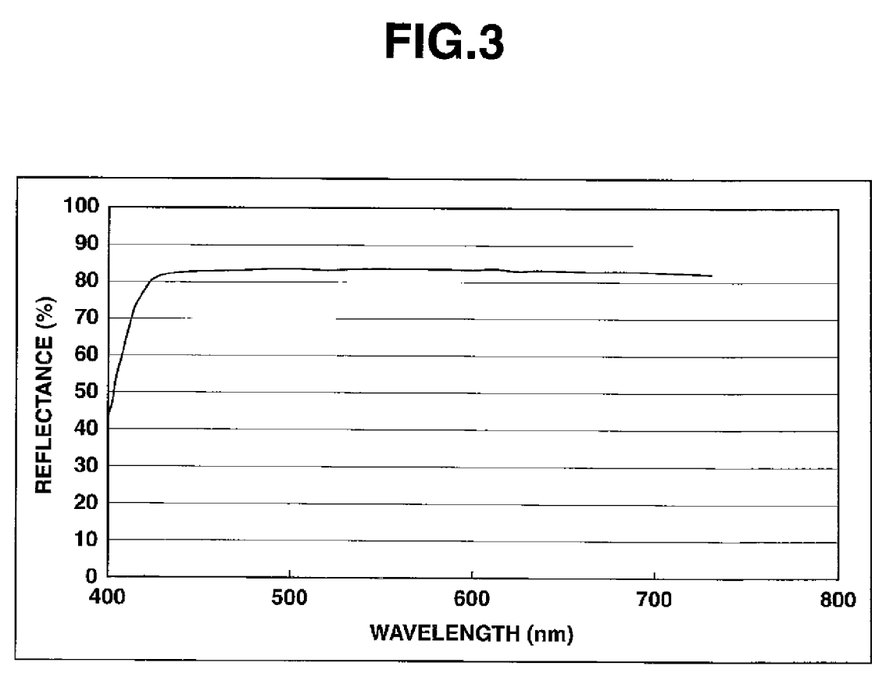
FIG. 3 is a diagram showing a reflectance of a molded part according to another embodiment of the invention.

A reflectance of a molded part is measured by irradiating light of a predetermined wavelength thereto. FIG. 3 is a diagram showing a reflectance of a molded part. It is seen that the molded part exhibits a very high reflectance to light having wavelengths of 430 nm or longer.

Example 11

Example 11 demonstrates a light-emitting device. In the light-emitting device of Example 11, an epoxy resin composition according to the invention is molded to form a molded part on a leadframe of copper alloy by a transfer molding technique. The molded part is provided with a recess having bottom and side surfaces. A light-emitting element of blue emission comprising a sapphire substrate and a light-emitting layer of InGaN is mounted using an epoxy resin adhesive. The light-emitting element is electrically connected to the leadframe using gold wires having a diameter of 30 μm. A sealing member is applied dropwise into the molded part with the recess on the bottom surface of which the light-emitting element is mounted. The sealing member used contains 100 parts by weight of a silicone resin, 30 parts by weight of a YAG phosphor, and 5 parts by weight of a light diffuser of silicon oxide. It is heated from room temperature to 150° C. over 3 hours, and cured at 150° C. for 5 hours. Finally, the frame is cut out, yielding a light-emitting device of white emission.

Comparative Example 1

Comparative Example 1 demonstrates a light-emitting device. In the light-emitting device of Comparative Example 1, polyphenylene sulfide (PPS) is molded to form a molded part on a leadframe of copper alloy by injection molding. The shape of the molded part is substantially the same as in Example 11. A light-emitting element of blue emission comprising a sapphire substrate and a light-emitting layer of InGaN is mounted using an epoxy resin adhesive. The light-emitting element is electrically connected to the leadframe using gold wires having a diameter of 30 μm. A sealing member is applied dropwise into the molded part with the recess on the bottom surface of which the light-emitting element is mounted. The sealing member used contains 100 parts by weight of a silicone resin, 30 parts by weight of a YAG phosphor, and 5 parts by weight of a light diffuser of silicon oxide. It is heated from room temperature to 150° C. over 3 hours, and cured at 150° C. for 5 hours. Finally, the frame is cut out, yielding a light-emitting device of white emission.

Comparison Test

The light-emitting devices of Example 11 and Comparative Example 1 were compared for performance and outer appearance when a current flow of 150 mA was conducted for 500 hours at room temperature.

TABLE 2

| Light-emitting device | Relative output (%) | Separation between molded part and sealing member (%) |
| --- | --- | --- |
| Example 11 | 100 | 0 |
| Comparative Example 1 | 30 | 100 |

The relative output (%) is an output after 500-hour current conduction relative to an output before current conduction which is 100%. The relative output is determined by measuring five samples for each of Example 11 and Comparative Example 1 and calculating an average thereof. The percent separation (or delamination) between molded part and sealing member is 0% when no separation occurred, and 100% when separation occurred along the entire interface. The separation between molded part and sealing member is reported when any separation is detectable even at a part of the interface between the molded part and the sealing member.

The percent separation indicates the number of separated samples among 100 samples prepared for each of Example 11 and Comparative Example 1.

It is thus seen that Example 11 is substantially better in heat resistance, light resistance and adhesion than Comparative Example 1.

Examples 12 to 15

An epoxy resin composition was prepared by melt mixing the reactive components selected from the components shown in Table 3 under the conditions shown in Table 3, grinding the solid reaction product thus obtained, and compounding it with the remaining components.

The solid reaction product and the cured product obtained by curing the epoxy resin composition on a transfer molding machine were examined for properties by the following methods. The results are also shown in Table 3.

Solid Reaction Product

The solid reaction product was analyzed by GPC under the following conditions. Using a chromatograph HLC-8120 (Tosoh Corp.) equipped with TSK guard columns HXL-L+ G4, 3, 2, 2HxL, analysis was performed under conditions: a sample concentration 0.2%, a feed volume 50 μL, a mobile phase THF 100%, a flow rate 1.0 mL/min, a temperature 40° C., and a detector RI.

From the GPC analysis data, the ratios of TEPIC monomer, MH monomer, moderate molecular weight fraction, and high molecular weight fraction were computed. The fraction ratio values in Table 3 are by weight.

TEPIC-S monomer: one area having a peak at 37.3±0.5 minutes

MH monomer: one area having a peak at 38.3±0.5 minutes moderate molecular area ranging from 30.8 to 36.8 minutes weight fraction:

high molecular area ranging from 0 to 30.7 minutes weight fraction:

Evaluation of Composition

The composition was examined and evaluated for gel time, yellowing, thermogravimetric-differential thermal analysis (TG-DTA) and strength.

Gel Time:

A sample, 1.0 g, was placed on a hot plate at 175° C., and at the same time measurement was started with a stopwatch. The sample on the hot plate was scraped, detecting the time when the sample started gelation.

Yellowing:

A sample, 10 g, was cured in an aluminum dish at 180° C. for 60 seconds, after which it was examined for yellowing. The cured sample was held at 180° C. for 24 hours, after which it was examined for yellowing again.

Rating

| ⊚ (excellent) | clear, colorless |
| ○ (good) | light yellow |
| Δ (fair) | light brown |
| X (poor) | brown |

TG-DTA:

Analysis was performed by molding a sample at 180° C. for 60 seconds into a disc specimen having a diameter of 10 mm and a height of 2 mm, heating at a rate of 5° C./min from room temperature to 500° C., obtaining a thermogravimetric curve, and determining the temperature corresponding to a weight loss of 0.2% from the curve.

Strength:

A sample was molded at 180° C. for 60 seconds into a specimen of 50×10×0.5 mm. Three-point flexural strength was measured at room temperature and a test speed of 2 mm/sec.

TABLE 3

| Component (pbw) | Example 12 | Example 13 | Example 14 | Example 15 |
|---|---|---|---|---|
| Pre-mixing | | | | |
| TEPIC-S | 45 | 45 | 45 | 45 |
| MH | 55 | 55 | 55 | 55 |
| Triphenyl phosphite | | 3 | 3 | |
| 2E4MZ | | | | 1 |
| Molar ratio of epoxy/acid anhydride in premix | 1.4 | 1.4 | 1.4 | 1.4 |
| Reaction conditions | 80° C./10 hr | 80° C./10 hr | 80° C./10 hr | 40° C./48 hr |
| Post-mixing | | | | |
| Triphenyl phosphite | 3 | | | 3 |
| 2E4MZ | 1 | 1 | | |
| U-CAT 5003* | | | 2 | |
| GPC data of solid reaction product | | | | |
| MH monomer ratio | 9.5 | 7.1 | 10.8 | 8.4 |
| TEPIC monomer ratio | 16.5 | 13.3 | 16.4 | 19.0 |
| Moderate MW fraction | 16.2 | 17.3 | 16.3 | 45.4 |
| High MW fraction | 51.6 | 53.8 | 49.0 | 21.6 |
| Cured properties | | | | |
| Gel time (sec) | 8 | 8 | 9 | 22 |
| Yellowing | | | | |
| as cured at 180° C. | ⊚ | ⊚ | ⊚ | ⊚ |
| after 180° C./24 hr | ○ | ⊚ | ⊚ | ○ |
| TG-DTA | 290° C. | 295° C. | 285° C. | 260° C. |
| Strength | 8.4 | 8.4 | 7.5 | 8.2 |

*phosphorus-based curing catalyst: quaternary phosphonium bromide (trade name U-CAT 5003 by San-Apro, Ltd.)

It is noted that the solid reaction products of Examples 12 to 15 contain a compound having the following formula with a molecular weight of more than 1,500, a compound having the following formula with a molecular weight of 300-1,500, and the monomers in proportions X, Y, and Z (expressed by weight), respectively.

[Chemical Formula 3]

Solid reaction product of Example 12
X=51.6 Y=16.2 Z=27.0
Solid reaction product of Example 13
X=53.8 Y=17.3 Z=20.4
Solid reaction product of Example 14
X=49.0 Y=16.3 Z=27.2
Solid reaction product of Example 15
X=23.8 Y=58.3 Z=10.2

It is noted that although compositions which have not been B-staged are applicable in some cases, B-staged compositions are preferred in the practice of the invention. This is because B-staged compositions are hard to yellow and maintain a high strength.

INDUSTRIAL APPLICABILITY

The light-emitting device of the invention can be utilized as luminaires, displays, mobile phone backlights, moving picture illuminating auxiliary light sources, and other general commercial light sources.

The invention claimed is:

1. A light-emitting device comprising
a light-emitting element comprising a gallium nitride compound semiconductor having an emission peak wavelength of 430 nm or longer,
a molded part formed from a thermosetting epoxy resin composition comprising an epoxy resin including a triazine derived epoxy resin as an essential component, and
a sealing member,
wherein the molded part together with at least one lead form a recess with a bottom surface and a side surface, the light-emitting element is disposed on the bottom surface of the recess and light from the light-emitting element is emitted from a light-emitting element surface that is opposite to the light-emitting element surface located adjacent to the bottom surface of the recess, and the sealing member is located in the recess and is surrounded by the side surface of the recess.

2. The light-emitting device of claim 1 wherein said molded part is a cured product of a thermosetting epoxy resin composition comprising (A) the epoxy resin including a triazine derived epoxy resin, and further comprising (B) an acid anhydride, (C) an antioxidant, (D) a curing catalyst, (E) a reflective member, and (F) an inorganic filler.

3. The light-emitting device of claim 2 wherein the reflective member (E) is loaded in an amount of 2 to 80% by weight of the thermosetting epoxy resin composition.

4. The light-emitting device of claim 1 wherein said thermosetting epoxy resin composition comprises a solid material in ground form obtained by melt mixing (A) the epoxy resin including a triazine derived epoxy resin with (B) an acid anhydride and (C) an antioxidant.

5. The light-emitting device of claim 1 wherein said thermosetting epoxy resin composition comprises as a resin component a solid material in ground form obtained by reacting a triazine derived epoxy resin with an acid anhydride in such a proportion as to provide an epoxy group equivalent/acid anhydride group equivalent ratio from 0.6 to 2.0.

6. The light-emitting device of claim 5 wherein said thermosetting epoxy resin composition further comprises (E) a reflective member and (F) an inorganic filler.

7. The light-emitting device of claim 1 wherein said molded part has a reflectance of not less than 70% at a wavelength of 430 nm or longer.

8. The light-emitting device of claim 1 wherein the light-emitting element is sealed with the sealing member which comprises an epoxy resin including a triazine derived epoxy resin or a silicon-containing resin.

9. A light-emitting device comprising
a light-emitting element having an emission peak wavelength of 430 nm or longer,
a molded part formed from a thermosetting epoxy resin composition comprising an epoxy resin including a triazine derived epoxy resin, an acid anhydride, a reflective member, and a curing catalyst as essential components, and
a sealing member,
wherein the molded part together with at least one lead form a recess with a bottom surface and a side surface, the light-emitting element is disposed on the bottom surface of the recess and light from the light-emitting element is emitted from a light-emitting element surface that is opposite to the light-emitting element surface located adjacent to the bottom surface of the recess, and the sealing member is located in the recess and is surrounded by the side surface of the recess.

10. The light-emitting device of claim 9 wherein in said thermosetting epoxy resin composition, the epoxy resin including a triazine derived epoxy resin and the acid anhydride are compounded as a solid material in ground form obtained by reacting the triazine derived epoxy resin with the acid anhydride in such a proportion as to provide an epoxy group equivalent/acid anhydride group equivalent ratio from 0.6 to 2.0.

11. The light-emitting device of claim 10 wherein the reaction of the triazine derived epoxy resin with the acid anhydride is effected in the presence of an antioxidant.

12. The light-emitting device of claim 10 wherein the reaction of the triazine derived epoxy resin with the acid anhydride is effected in the presence of the curing catalyst or the curing catalyst and an antioxidant, so that the curing catalyst is compounded as the solid material in ground form.

13. A method for preparing a light-emitting device comprising
the first step of mixing a solid material in ground form obtained by melt mixing (A) an epoxy resin including a triazine derived epoxy resin with (B) an acid anhydride and (C) an antioxidant, with (D) a curing catalyst, (E) a reflective member, and (F) an inorganic filler,
the second step of molding a thermosetting epoxy resin composition resulting from the first step in a mold with leads arranged in place by a transfer molding technique,
the third step of disposing a light-emitting element on the leads on a cured product of the thermosetting epoxy resin composition resulting from the second step, and
the fourth step of disposing a sealine member over the light-emitting element, in a recess formed by the leads and the thermosetting epoxy resin composition.

14. A method for preparing a light-emitting device comprising
the first step of mixing a solid material in ground form obtained by reacting a triazine derived epoxy resin with an acid anhydride in such a proportion as to provide an epoxy group equivalent/acid anhydride group equivalent ratio from 0.6 to 2.0, with (D) a curing catalyst, (E) a reflective member, and (F) an inorganic filler,
the second step of molding a thermosetting epoxy resin composition resulting from the first step in a mold with leads arranged in place by a transfer molding technique,
the third step of disposing a light-emitting element on the leads on a cured product of the thermosetting epoxy resin composition resulting from the second step, and the fourth step of disposing a sealing member over the light-emittint element, in a recess formed by the leads and the thermosetting epoxy resin composition.

15. The method of claim 14 wherein the reaction of a triazine derived epoxy resin with an acid anhydride is effected in the presence of an antioxidant.

16. The method of claim 14 wherein the reaction of a triazine derived epoxy resin with an acid anhydride is effected in the presence of the curing catalyst or the curing catalyst and an antioxidant, so that the curing catalyst is compounded as the solid material in ground form.

17. The method for preparing a light-emitting device as recited in claim 13, wherein the reaction of a triazine derived epoxy resin with an acid anhydride is effected in the presence of an antioxidant.

18. The method for preparing a light-emitting device as recited in claim 13, wherein the reaction of a triazine derived epoxy resin with an acid anhydride is effected in the presence of a curing catalyst or a curing catalyst and an antioxidant.

19. The light-emitting device of claim 2, wherein titanium dioxide or barium titanate or zinc oxide is included in the reflective member as component (E).

20. The light-emitting device of claim 19, wherein an amount of titanium dioxide loaded is more than 5% by weight of the thermosetting epoxy resin composition.

21. The light-emitting device of claim 9, wherein said molded part has a reflectance of not less than 70% at a wavelength of 430 nm or longer.

22. The light-emitting device of claim 21, wherein titanium dioxide or barium titanate or zinc oxideis included in the reflective member.

23. The light-emitting device of claim 22, wherein an amount of titanium dioxide loaded is 2 to 80% by weight of the thermosetting epoxy resin composition.

24. The light-emitting device of claim 22, wherein an amount of titanium dioxide loaded is more than 5% by weight of the thermosetting epoxy resin composition.

25. The light-emitting device of claim 9, wherein the light-emitting element is sealed with a sealing member comprising a silicon-containing resin.

26. The light-emitting device of claim 1, wherein the molded part together with first and second leads form said recess.

27. The light-emitting device of claim 9, wherein the molded part together with first and second leads form said recess.

\* \* \* \* \*